United States Patent [19]

Akiba et al.

[11] Patent Number: 5,646,204

[45] Date of Patent: Jul. 8, 1997

[54] EPOXY RESIN COMPOSITION AND RESIN-ENCAPSULATED SEMICONDUCTOR DEVICE

[75] Inventors: Masatsugu Akiba, Ibaraki-ken; Yutaka Shiomi, Osaka-fu; Kazuo Takebe, Osaka-fu; Noriaki Saito, Osaka-fu; Takashi Morimoto, Ehime-ken, all of Japan

[73] Assignee: Sumitomo Chemical Company, Limited, Osaka, Japan

[21] Appl. No.: 525,159

[22] Filed: Sep. 8, 1995

[30] Foreign Application Priority Data

Sep. 8, 1994 [JP] Japan ..................... 6-214820

[51] Int. Cl.⁶ ..................... C08G 59/24; C08G 59/62; H01L 23/29
[52] U.S. Cl. .................... 523/443; 523/466; 523/457; 523/458; 549/556; 257/786; 257/793; 525/481; 525/484; 528/101
[58] Field of Search ............... 549/556; 257/786, 257/793; 528/101; 525/481, 484; 523/466, 457, 458, 443

[56] References Cited

U.S. PATENT DOCUMENTS

| | | | |
|---|---|---|---|
| 3,295,974 | 1/1967 | Erdmann | 961/35 |
| 3,410,824 | 11/1968 | Atkinson | 549/556 |
| 3,937,685 | 2/1976 | Kolbel et al. | 549/556 |
| 4,282,353 | 8/1981 | Green | 542/438 |
| 4,719,502 | 1/1988 | Ikeya et al. | 357/72 |
| 4,876,324 | 10/1989 | Nakano et al. | 528/142 |
| 5,266,660 | 11/1993 | Hefner, Jr. et al. | 525/481 |
| 5,270,404 | 12/1993 | Earls et al. | 525/481 |
| 5,270,405 | 12/1993 | Earls et al. | 525/481 |
| 5,292,831 | 3/1994 | Earls et al. | 525/481 |
| 5,463,091 | 10/1995 | Earls et al. | 525/481 |

FOREIGN PATENT DOCUMENTS

| | | |
|---|---|---|
| 0379057 | 7/1990 | European Pat. Off. . |
| 2442840 | 6/1980 | France . |
| 2256961 | 5/1974 | Germany . |
| 2038803 | 7/1980 | United Kingdom . |

*Primary Examiner*—Frederick Krass
*Attorney, Agent, or Firm*—Cushman Darby & Cushman, IP Group of Pillsbury Madison & Sutro, LLP

[57] ABSTRACT

An epoxy resin composition comprising (A) an epoxy resin represented by the general formula (1)

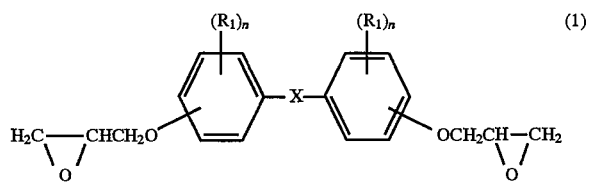

wherein each $R_1$, independent of the other, represents hydrogen, a hologen atom, an alkyl group having 1 to 6 carbon atoms, substituted- or nonsubstituted-phenyl groups, and X represents

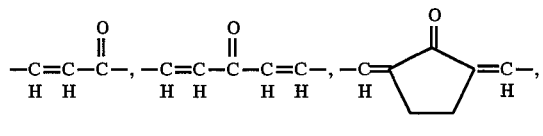

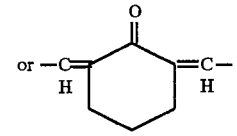

and n represents an integer of 0 to 4, and (B) a curing agent, which composition provides a cured product exhibiting low hygroscopicity and high adhesiveness.

9 Claims, 2 Drawing Sheets

EPOXY RESIN COMPOSITION AND RESIN-ENCAPSULATED SEMICONDUCTOR DEVICE

FIELD OF THE INVENTION

The present invention relates to an epoxy resin composition useful for encapsulating electronic parts, and to a resin-encapsulated semiconductor device.

BACKGROUND OF THE INVENTION

Recently, semiconductor devices such as a LSI, IC, transistor or the like have been encapsulated by transfer molding with an epoxy resin. For instance, surface mounting of LSI devices has been conducted. In the latter regard, a process involving direct immersion in a solder bath is becoming more common. During the immersion, the encapsulating material is exposed to a high temperature not lower than 200° C. However, the encapsulating material contains water. As a consequence, the moisture contained in the encapsulating material is vaporized and expanded which causes cracks or peeling at the interface with a die pad.

Currently the most popular encapsulating materials are based on an epoxy resin which is a glycidyl ether of o-cresol novolak together with a phenol novolak as a curing agent. The encapsulating materials comprising mainly glycidyl ethers of o-cresol novolak and phenol novolaks must achieve some balance between the competing properties of heat resistance and moldability. However, these popular materials are not sufficient for use in applications which require a high level of non-hygroscopicity as described above, and suffer the added drawback of solder cracking. As a practical matter, these encapsulating materials are marketed in the wrapped form with moisture-proof wraps to avoid the above-noted problems with hygroscopicity.

In view of the above and other drawbacks, the art has sought to provide encapsulating resin materials which are even less hygroscopic, exhibit improved resistance to cracking and show higher adhesiveness.

SUMMARY OF THE INVENTION

An object of our invention is to solve the above-noted drawbacks by providing a novel curable, low-viscosity epoxy resin composition.

Another object of our invention is to provide a cured epoxy resin product having the sought after combination of low hygroscopicity, improved resistance to cracking, and high adhesiveness, A further object of our invention is to provide a semiconductor device encapsulated with our epoxy resin.

These and other objectives are satisfied by our discovery of an epoxy resin composition and a resin-encapsulated semiconductor device produced by encapsulating a semiconductor device(s) with our epoxy resin composition wherein the epoxy resin composition comprises (A) an epoxy resin represented by the general formula (1)

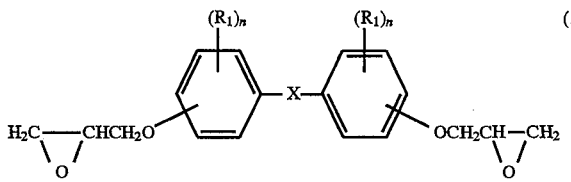

wherein each $R_1$, independent of the other, represents hydrogen, halogen, an alkyl group having 1 to 6 carbon atoms, substituted- or nonsubstituted-phenyl groups, and X represents

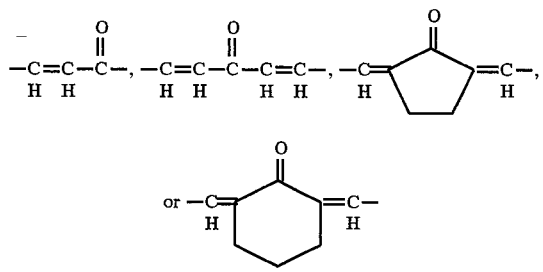

and n represents an integer of 0 to 4, and (B) a curing agent.

DETAILED DESCRIPTION OF THE INVENTION

Figure 1:
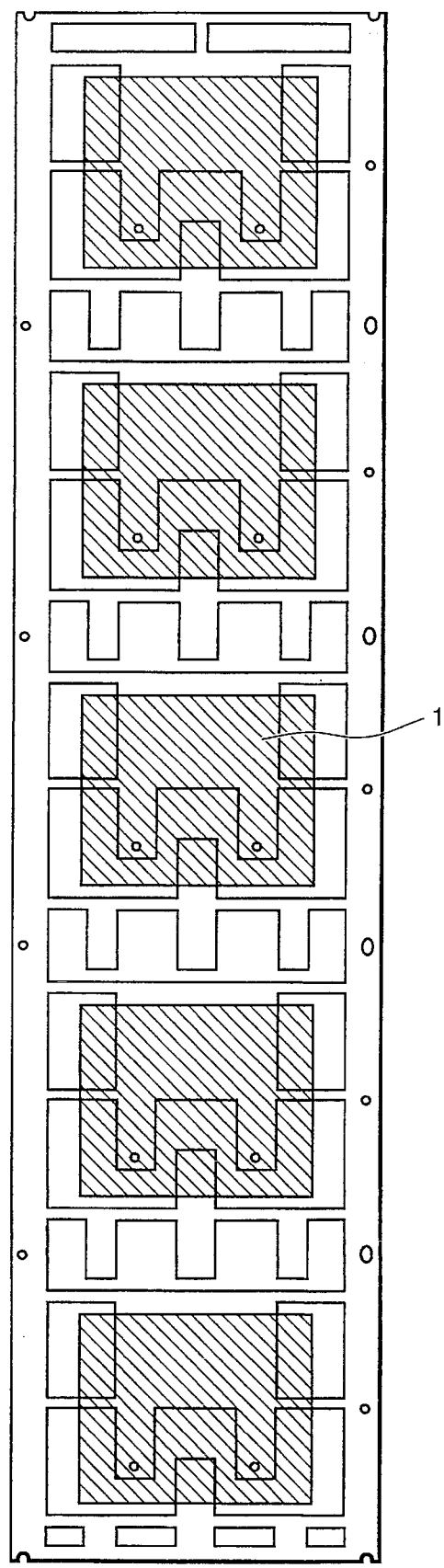
FIG. 1 is a plan view of a frame made of copper or 42-alloy for the measurement of the adhesive strength in the Examples, wherein numeral 1 (hatched part) denotes a molding portion of a resin composition to be cured.
Figure 2A:
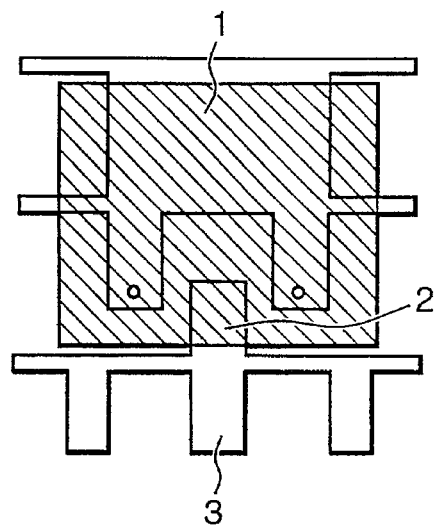
FIG. 2(A) depicts one of the test sample which is cut out from the frame shown in FIG. 1.
Figure 2B:
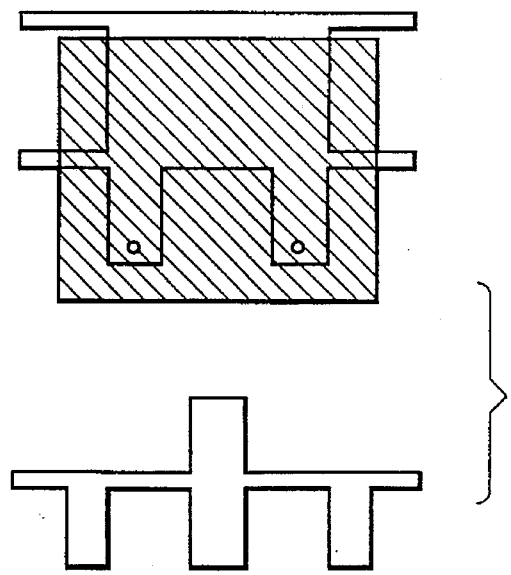
FIG. 2(B) depicts the test sample after measurement of the adhesive strength. Numeral 2 denotes an area to be peeled off by the application of tensile force, and numeral 3 denotes holding parts for the tensile test operation.

In epoxy resin (A) represented by the general formula (1), when $R_1$ represents an alkyl of 1 to 6 carbon atoms, it can be aliphatic or cycloaliphatic, and exemplars include methyl, ethyl, propyl, cyclopropyl, butyl, iso-butyl, t-butyl, amyl, cyclopentyl, hexyl, and cyclohexyl. $R_1$ can also represent a substituted or unsubstituted phenyl group, and exemplars include tolyl and xylyl groups. $R_1$ can represent a halogen atom such as a chlorine or a bromine atom. By preference, $R_1$ represents hydrogen or an alkyl group having 1 to 4 carbon atoms. Each $R_1$ can be the same or different.

The epoxy resin represented by the general formula (1) can be obtained by a method which comprises a glycidyl etherifying reaction of a phenol. The method involves a reaction of a phenol with epihalohydrin in the presence of a base, such as an inorganic alkali metal hydroxide, such as, for instance, sodium hydroxide. To obtain a highly pure product, the reaction is preferably conducted in an aprotic solvent as described in Japanese Patent Kokai 60-31517. For instance, in the method of this Japanese Patent Kokai, mono- or poly-hydric phenols can be reacted with about 2.5 to 20 mols, per mol of phenolic hydroxy group, of epichlorohydrin in the presence of an alkali metal hydroxide and an aprotic polar solvent. Aprotic solvents include, for example, dimethyl sulphoxide and dimethyl formamide tetramethyl urea.

Phenols to be used in the above reaction are represented by the general formula (2):

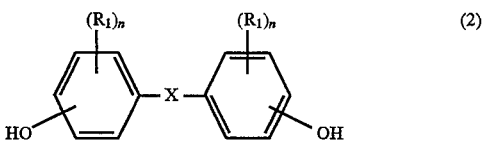

wherein $R_1$, X and n are the same as those defined for the general formula (1). Specific examples of the phenols include:

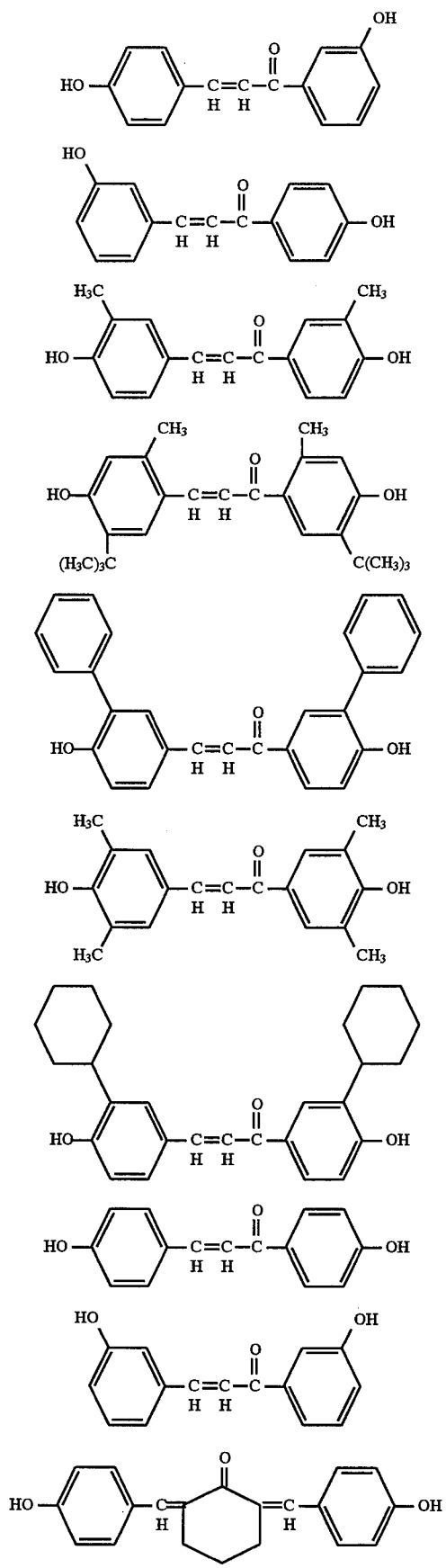

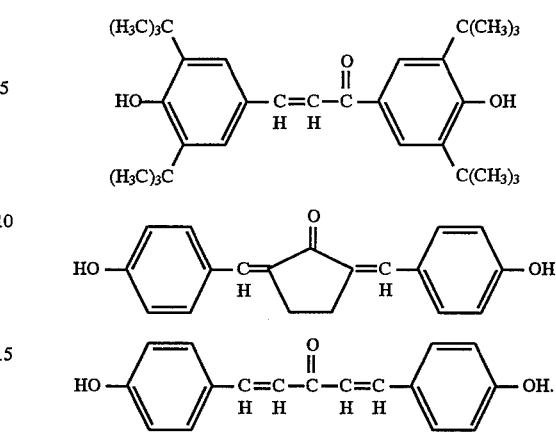

The epoxy resin, component (A) herein, can be used by itself or in a mixture with one or more of the known epoxy resins. Exemplars of these known epoxy resins include novolak epoxy resins such as the reaction products of a phenol such as phenol, o-cresol or the like with a formaldehyde; glycidyl ether compounds derived from tri- or higher valent phenols such as phloroglucin, tris-(4-hydroxyphenyl)-methane, 1,1,2,2-tetrakis (4-hydroxphenyl)-ethane and the like; glycidyl ether compounds derived from divalent phenols such as bisphenol A, bisphenol F, tetramethylbisphenol, hydroquinone, resorcin, 4,4'-thio-di (2,6-dimethylphenol), dihydroxynaphthlene, bis (hydroxphenyl) dicyclopentane, bis(hydroxphenyl)mentane and the like, or halogenated bisphenols such as tetrabromobisphenol A, and the like; glycidyl ether compounds of polyhydric phenols produced by condensation of phenols with aromatic carbonyl compounds; amine based epoxy resins derived from p-aminophenol, m-aminophenol, 4-amino-m-cresol, 4,4'-diaminodiphenyl methane, 3,3'-diaminodiphenyl methane, 4,4'-diaminodiphenyl ether, 3,4'-diaminodiphenyl ether, 1,4-bis(4-aminophenoxy)benzene, 1,4-bis(3-aminophenoxy)benzene, 1,3-bis(4-aminophenoxy)benzene, 1,3-bis(3-aminophenoxy)benzene, 2,2-bis(4-aminophenoxphenyl)propane, p-phenylene diamine, m-phenylene diamine, 2,4-toluene diamine, 2,6-toluene diamine, p-xylylene diamine, m-xylylene diamine, 1,4-cyclohexane-bis(methylamine), 1,3-cyclohexane-bis (methylamine) and the like; glycidyl ester compounds derived from aromatic carboxylic acids such as p-oxybenzoic acid, m-oxybenzoic acid, tetraphthalic acid, isophthalic acid; hydantoic epoxy compounds derived from 5,5-dimethyl hydantoin, and the like; alicyclic epoxy resins of 2,2-bis(3,4-epoxycyclohexyl)propane, 2,2-bis[4-(2,3-epoxypropyl)cyclohexyl]propane, vinylcyclohexene dioxide, 3-4-epoxycyclohexylmethyl-3,4-epoxycyclohexane carboxylate, and the like; N,N-diglycidyl aniline.

The curing agent, component (B) herein, can be any one of the known curing agents for epoxy resins, or a mixture thereof. Exemplary curing agents include polyvalent phenols such as phenol novolak, aralkylphenol novolak, and the like; amines such as dicyandiamide, diaminodiphenylmethane, diaminodiphenyl sulfone and the like; acid anhydrides such as pyromellitic anhydride, trimellitic anhydride, benzophenonetetracarboxylic acid anhydride and the like. Polyvalent phenols are preferable from a viewpoint of low hygroscopicity.

The phenol curing agents are further exemplified as polycondensation products of one or more phenols with aldehydes or ketones. In addition to phenol itself, various alkyl phenols, naphtol and the like can be used. Aldehydes include, for example, formaldehyde, acetaldehyde, acrolein, glyoxal, benzaldehyde, naphtaldehyde, hydroxybenzaldehyde and the like. Ketones include, for instance, cyclohexanone, acetophenone and the like.

Vinyl polymerizable type polyvalent phenols such as polyvinylphenol, polyisopropenylphenol and the like, and Friedel-Crafts reaction products of phenols can be used. Compounds used for Friedel-Crafts reaction with phenols are diol compounds represented by the formula below:

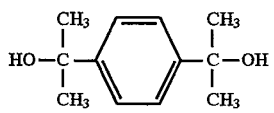

dialkoxy compounds represented by the formula below:

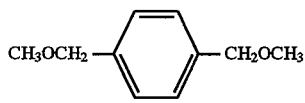

dihalogen compounds represented by the formula below:

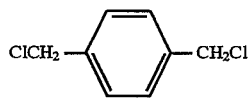

and diolefin compounds such as dicyclopentadiene, diisopropenyl benzene and the like. These curing agents may be used alone or in the form of a mixture of two or more of them.

In general, an effective amount of curing agent (B) can be incorporated in our composition. The proportion of the at least one curing agent (B) to the epoxy resin (A) to be incorporated in the composition of the present invention is about 0.7 to about 1.2 equivalents based on the epoxy groups in epoxy resin (A). Using curing agent (B) in amount less than about 0.7 equivalent or greater than about 1.2 equivalents based on the epoxy group results in insufficient curing.

Known curing promotors, e.g. accelerators, can be employed when the resin composition of the present invention is to be cured. Exemplary curing promotors include, among others, organic phosphine compounds such as triphenyl phosphine, tri-4-methylphenyl phosphine, tri-4-methoxy phenyl phosphine, tributyl phosphine, trioctyl phosphine, tri-2-cyanoethylphosphine, and the like, and tetraphenylborate salts thereof; tertiary amines such as tributylamine, triethylamine, 1,8-diazabicyclo[5,4,0] undecen-7-triamylamine, and the like; quaternary ammonium salts such as ammonium benzyl trimethylchloride, ammonium benzyl trimethyl hydroxide, triethylammonium tetraphenylborate, and the like; and imidazoles such as, for instance, 4-methyl-imidazole and 2-ethyl4-methyl-imidazole. Among these, organic phosphine compounds, 1,8-diazabicyclo[5,4,0]undecen-7-triamylamine, and imidazoles are preferred from the standpoint of resistance to humidity and curability. Triphenyl phosphine is most preferred.

The composition of the present invention can further comprise (C) one or more inorganic fillers. The fillers include, among others, silica, alumina, titanium white, aluminum hydroxide, talc, clay, and glass fibers. In particular, silica and alumina are preferred. These can be used in a mixture of different shapes (e.g. sphere or crushed types) and different sizes to increase the filler content. The proportion of the inorganic fillers to be incorporated for use in encapsulating semiconductors is generally in the range of about 25% to about 92% by weight, preferably about 70% to about 92% by weight, based on the total of (A), (B) and (C) the resin composition. A proportion less than about 25% by weight may result in void generation in the molded articles due to insufficient pressure applied during molding and processing, whereas a proportion higher than about 92% by weight is problematic in terms of processability.

Our composition may also include, for example, mold release agents such as naturally occurring waxes, synthetic waxes, higher fatty acids and metal salts thereof, or paraffins; coloring agents such as carbon black; and surface treating agents such as silane coupling agents, and the like. Silane coupling agents include, among others, γ-glycidoxypropyl trimethoxysilane, γ-(2-aminoethyl) aminopropyl trimethoxysilane, γ-anilinopropyl trimethoxysilane, vinyl triacetoxysilane, and γ-chloropropylmethyl dimethoxysilane. In addition, flame retardants such as antimony trioxide (alone or in combination with a halogen source), phosphorus compounds, brominated epoxy resins, and the like may be added. In order to achieve the flame retarding effects, the use of brominated epoxy resin is preferred.

As known to those skilled in the art, some materials which can function as fillers can also impart flame retardancy. Accordingly, compounds such as antimony oxide or aluminum hydroxide can be used, if desired, as a filler which can impart some flame retardancy to the composition.

In order to reduce stress imposed during encapsulation, various elastomers may be added or pre-reacted (e.g. by the reaction with an epoxy resin before compounding). Additive or reactive type elastomers such as polybutadiene, butadiene-acrylonitrile copolymer, silicone rubbers, silicone oils, and the like are suitable.

Resin-encapsulated semiconductor devices can be made by molding and curing the resin composition of the present invention in accordance with any one of known prior forming techniques such as transfer molding, compression molding, injection molding and the like.

An epoxy resin and an encapsulated semiconductor device encapsulated therewith are described in Japanese application 6-214820 filed Sep. 8, 1994, the complete disclosure of which is incorporated herein by reference.

The present invention will be illustrated with reference to the following Examples, without being limited thereto.

EXAMPLES

In Examples, epoxy equivalent weight is defined as a molecular weight of an epoxy resin per epoxy group.

A hydrolyzable chlorine content of an epoxy resin was determined by reverse titration of isolated chlorine with silver nitrate aqueous solution. The isolated chlorine was generated by adding an alcoholic solution of potassium hydroxide to a dioxane solution of an epoxy resin, and then refluxing for 30 minutes.

Blends and cured shapes were evaluated as follows:

The gel time was measured using a gellation tester (Nisshin Kagaku Co., Ltd.) at 180° C.

The Barcol hardness determination was effected with a hardness tester model 935 (Barber-Colman Company) under the condition of 175° C./90 seconds according to ASTM D-648.

The glass transition temperature determination was effected using a thermomechanical analyzer (SHIMADZU DT-30).

The flexural strength, flexural modulus, determination was made with an Instron Universal Tester (SHIMADZU IS-10T) according to JIS K-6911.

The water absorbance determination was effected measuring the variation in weight at a temperature of 85° C. and a relative humidity of 85% using a constant temperature humidity incubator (Advantec Toyo, AGX-326).

The spiral flow determination was conducted at a temperature of 175° C. and at 70 kg/cm² according to EMMI-1-66.

The adhesive strength determination was effected using a sample was transfer molded on a copper-frame and 42 alloy-frame, and evaluating the adhesive strength between the sample and the frames.

The solder cracking property determination was effected as follows. A simulated IC (QFP package with 52 pins, a package thickness of 2.05 mm) was moistened under the conditions of a temperature of 85° C. and a relative humidity of 85° C. for 72 hours, and immediately thereafter immersed in a soldering bath at 240° C. for 30 seconds, followed by counting the numbers of ICs having cracks generated. The number of tested ICs was eight. The counting was conducted using an ultrasonic reflectscope.

Referential Example 1

Synthesis of a Phenol as a Raw Material

Into a 3-liter reactor equipped with a thermometer, a stirrer and a condenser, 136.2 g (1.0 mol) of p-hydroxyacetophenone, 122.1 g (1.0 mol) of p-hydroxybenzaldehyde and 600 g of methanol were charged, and after the reactants dissolved, 51.0 g (0.50 mol) of a 97% sulfuric acid were added, the temperature was raised to 60° C., and then the reaction mixture was maintained at the same temperature for 13 hours. The reaction mixture was poured into water for crystallization. The obtained crystals were filtered and washed 4 times with 1000 g of water, and then dried in vacuo at 80° C. for 5 hours. Red colored crystals having a melting point of 164° C. by DSC were obtained (this is referred to as DHCNP).

Referential Example 2

Synthesis of a Phenol as a Raw Material

Into a 3-liter reactor, 136.2 g (1.0 mol) of m-hydroxyacetophenone, 122.1 g (1.0 mol) of p-hydroxybenzaldehyde and 640 g of methanol were charged, and after the reactancts dissolved, 51.0 g (0.50 mol) of a 97% sulfuric acid were added, the temperature was raised to 60° C., and then the rection mixture was maintained at the same termperature for 10 hours. The reaction mixture was poured into water for crystallization. The obtained crystals were filtered and washed 4 times with 1000 g of water, and then dried in vacuo at 80° C. for 5 hours. Red-brown colored crystals having a melting point of 181° C. were obtained (referred to as DHCNM hereunder).

Referential Example 3

Synthesis of a Phenol as a Raw Material

Into a 3-liter reactor, 49.1 g (0.5 mol) of cyclohexanone, 122.1 g (1.0 mol) of p-hydroxybenzaldehyde and 400 g of ethanol were charged, and after the reactants dissolved, 50.8 g (0.50 mol) of a 36% hydrochloric acid were added, the temperature was raised to 80° C., and then the reaction mixture was maintained at the same temperature for 6 hours. The obtained crystals were filtered and washed 4 times with 1000 g of water, and then dried in vacuo at 80° C. for 5 hours. Brown colored crystals having a melting point of 284° C. were obtained (referred to as DHCH).

Referential Example 4

Synthesis of an Epoxy Resin

Into a reactor equipped with a thermometer, a stirrer, a funnel and a condenser having a separating tube, 120.0 g of phenol DHCNP obtained in the Referential Example 1, 647.5 g of epichlorohydrin and 323.8 g of dimethylsulfoxide were charged, and after the reactants dissolved, 82.82 g of a 48.3% sodium hydroxide were added dropwise over 5 hours, under the reaction conditions of 43 torr and 48° C. Meanwhile, the reaction temperature was maintained at 48° C., and the azeotropically vaporized epichlorohydrin and water were liquified by cooling, and the organic layer was recirculated, e.g. supplied back, into the reaction phase to continue the reaction. Unreacted epichlorohydrin was removed by evaporation, and the glycidyl ether product was dissolved in 413 g of methylisobutylketone and washed with water to remove a residual by-product-salt and dimethylsulfoxide. Methylisobutylketone was distilled off at 170° C. and at 10 torr, and a glycidyl ether product having a melting point of 106° C., a melt viscosity of 0.22 poise at 150° C. and an epoxy equivalent value of 19 g/eq. was obtained (referred to a DHCP-E).

Referential Example 5

Synthesis of an Epoxy Resin

Into a reactor equipped with a thermometer, a stirrer, a funnel and a condenser having a separating tube, 120.0 g of phenol DHCNM obtained in the Referential Example 2, 647.5 g of epichlorohydrin and 323.8 g of dimethylsulfoxide were charged, and after the reactants dissolved, 82.82 g of a 48.3% sodium hydroxide were added dropwise over 5 hours, under the reaction conditions of 43 torr and 48° C. Meanwhile, the reaction temperature was maintained at 48° C., azeotropically vaporized epichlorohydrin and water were liquified by cooling, and the organic layer was reciruclated, e.g. supplied back, into the reaction phase to continue the reaction. Unreacted epichlorohydrin was removed by evaporation, and the glycidyl ether product was dissolved in 413 g of methylisobutylketone and washed water to remove a residual by-product-salt and dimethylsulfoxide. Methylisobutylketone was distilled off at 170° C. and at 10 torr, and a glycidyl ether liquid product having a melt viscosity of 0.42 poise at 150° C. and epoxy equivalent value of 186 g/eq. was obtained (referred to as DHCAM-E).

Referential Example 6

Synthesis of an Epoxy Resin

Into a reactor equipped with a thermometer, a stirrer, a funnel and a condenser having a separating tube, 120.0 g of DHCH obtained in the Referential Example 3, 507.3 g of epichlorohydrin and 253.7 g of dimethylsulfoxide were charged, and after the reactants dissolved, 64.88 g of a 48.3% sodium hydroxide were added dropwise over 5 hours, under the reaction conditions of 43 torr and 48° C. Meanwhile, the reaction temperature was maintained at 48° C., and azeotropically vaporized epichlorohydrin and water were liquified by cooling, and the organic layer was recirculated, e.g. supplied back, into the reaction phase to continue the reaction. After the reaction, unreacted epichlorohydrin was removed by evaporation, and the glycidyl ether product was dissolved in 950.0 g of methylisobutylketone and then washed with water to remove a residual by-product-salt and dimethylsulfoxide. Methylisobutylketone was distilled off at 170° C./10 torr and a glycidyl ether product having a melting point of 125° C., melt viscosity of 0.33 poise at 150° C. and epoxy equivalent value of 224.6 g/eq. was obtained (referred to as DHCH-E).

Referential Examples 7–11, Comparative Examples 1–2

Using the glycidyl ethers obtained in the Referential Examples 4–6 as described above (DHCAP-E, DHCAM-E and DHCH-E), and glycidyl ether of o-cresol novolak (Sumitomo Chemical Co., Ltd.; trade name Sumi-Epoxy ESCN-195XL, an epoxy equivalent of 195 g/eq., softening point of 65.6° C., melt viscosity of 2.6 poise (150° C.)) and a phenol novolak (available from Gunei Kagaku Kogyo Co., Ltd.; trade name PSM4261, softening point of 81° C.) as a curing agent, triphenyl phosphine as curing promoter fused silica shown below as a filler, carnauba wax as a mold releasing agent, and a coupling agent (Toray Dow Corning Silicone; trade name of SH-6040) were incorporated in amounts (g) as indicated in Table 1, heat-kneaded with a roll, and transfer molded.

The transfer moldings were post-cured for 5 hours in an oven at a temperature of 180° C. to produce cured shapes. The results are set forth in Table 2.

The fused silicas used in these Examples were as follows:

FS-891: Crushed silica (Denki Kagaku Kogyo Co., Ltd., mean diameter of 13 μm).

FS-20: Crushed silica (Denki Kagaku Kogyo Co., Ltd., mean diameter of 5.6 μm).

FB-74: Spherical silica (Denki Kagaku Kogyo Co., Ltd., mean diameter of 30 μm).

Adomafine SOC-2: Spherical silica (Adomatec Co., Ltd., mean diameter of 0.4 μm).

Silstar MK-06: Spherical silica (Nippon Kagaku Kogyo Co., Ltd., mean diameter of 4.9 μm).

Excelica SE40: Spherical silica (Tokuyama Soda Co., Ltd., mean diameter of 40.4 μm).

TABLE 1

|  | Ex. 7 | Ex 8 | Ex. 9 | Ex. 10 | Ex. 11 | Comp. Ex. 1 | Comp. Ex. 2 |
|---|---|---|---|---|---|---|---|
| (Epoxy resin) | | | | | | | |
| DHCAP-E | 100 | 100 | — | — | — | — | — |
| DCAM-E | — | — | 100 | 100 | — | — | — |
| DHCH-E | — | — | — | — | 100 | — | — |
| Sumi-Epoxy ESCN-195XL | — | — | — | — | — | 100 | 100 |
| (Hardner) | | | | | | | |
| Phenol novolak | 55.8 | 55.8 | 61.8 | 61.8 | 47.2 | 53.8 | 53.8 |
| Triphenylphosphine | 1.5 | 1.0 | 1.5 | 1.0 | 1.0 | 1.5 | 1.5 |
| (Filler) | | | | | | | |
| FS-891 | 152 | — | 158 | — | — | 150 | — |
| FS-20 | — | 140.2 | — | 145.6 | 132.5 | — | 138.5 |
| FB-74 | 609 | — | 633 | — | — | 601 | — |
| Adomafine SOC-2 | — | 151.4 | — | 157.3 | 143.1 | — | 149.5 |
| Silstar MI-06 | — | 252.4 | — | 262.1 | 238.5 | — | 249.3 |
| Excelica SE-40 | — | 858.1 | — | 891.2 | 810.9 | — | 847.5 |
| carnauba wax | 2.30 | 3.39 | 2.40 | 3.54 | 3.20 | 2.29 | 3.35 |
| Silane coupling agent SH-60H0 | 3.10 | 4.51 | 3.22 | 4.68 | 4.26 | 3.05 | 4.45 |

(Epoxy resin)

DHCAP-E $$H_2C\underset{O}{\overset{}{\diagdown\diagup}}CHCH_2O-\phenyl-\underset{H\ H}{C=C}-\overset{O}{\overset{\|}{C}}-\phenyl-OCH_2CH\underset{O}{\overset{}{\diagdown\diagup}}CH_2$$

DHCAM-E $$H_2C\underset{O}{\overset{}{\diagdown\diagup}}CHCH_2O-\phenyl-\underset{H\ H}{C=C}-\overset{O}{\overset{\|}{C}}-\phenyl-OCH_2CH\underset{O}{\overset{}{\diagdown\diagup}}CH_2$$

DHCH-E $$H_2C\underset{O}{\overset{}{\diagdown\diagup}}CHCH_2O-\phenyl-\underset{H}{\overset{}{C=}}\overset{O}{\underset{}{\text{(cyclohexanone)}}}\underset{H}{\overset{}{=C}}-\phenyl-OCH_2CH\underset{O}{\overset{}{\diagdown\diagup}}CH_2$$

TABLE 2

|  | Ex. 7 | Ex. 8 | Ex. 9 | Ex. 10 | Ex. 11 | Comp. Ex. 1 | Comp. Ex. 2 |
|---|---|---|---|---|---|---|---|
| Gel Time (Sec) | 23 | 31 | 24 | 30 | 29 | 33 | 25 |
| Spiral Flow (inch) | 24.0 | 26 | 29.5 | 30.2 | 23.0 | 20.0 | 3 |
| Barcol hardness | 74 | 80 | 77 | 81 | 78 | 80 | [1]Not measured |
| Glass Transition Temp. | 176 | 165 | 156 | 160 | 162 | 153 | |
| Flexural strength at 20° C. (kg/mm$^2$) | 15.3 | 16.3 | 17.0 | 16.5 | 17.5 | 12.4 | |
| Flexural modulus at 20° C. (kg/mm$^2$) | 1810 | 2470 | 1910 | 2500 | 2700 | 2626 | |
| Flexural strength at 120° C. (kg/mm$^2$) | 1.72 | 2.62 | 1.14 | 2.21 | 2.96 | 1.51 | |
| Flexural modulus at 120° C. (kg/mm$^2$) | 153 | 320 | 111 | 280 | 292 | 190 | |
| Adhesive strength to Cooper frame (kg/mm$^2$) | 0.088 | 0.085 | 0.089 | 0.090 | 0.085 | 0.033 | |
| Adhesive strength to 42 frame (kg/mm$^2$) | 0.073 | 0.070 | 0.080 | 0.082 | 0.081 | 0.028 | |
| % water absorbance 72 hr | 0.278 | 0.165 | 0.221 | 0.124 | 0.130 | 0.245 | |
| Soder cracking property | 2 | 0 | 1 | 0 | 0 | 8 | |

[1]Preparation of a molded test sample was impossible due to bad flowability.

The epoxy resin composition of the present invention has low viscosity and low hygroscopicity, and cured products thereof have a desired improvement in low hygroscopic property, and also show high adhesiveness. The resin-encapsulated semiconductor devices produced with this composition also exhibit excellent resistance to solder-cracking.

Our epoxy resin composition has low viscosity compared with a glycidyl ether of o-cresol novolak and can contain a large amount of fillers. Our composition exhibits an unexpected improvement in low hygroscopicity, and the reliability of products thereof is enhanced.

What is claimed is:

1. An epoxy resin composition comprising (A) an epoxy represented by the general formula (1)

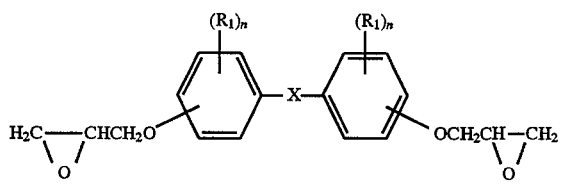

wherein each R$_1$, independent of the other, represents hydrogen, an alkyl group having 1 to 6 carbon atoms, inertly substituted- or nonsubstituted-phenyl groups or halogen, and X represents

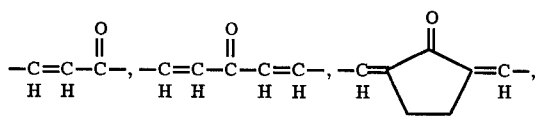

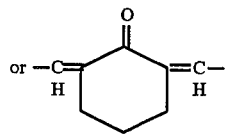

and n represents an integer of 0 to 4, (B) about 0.7 to about 1.2 equivalents, per epoxy equivalent, of a polyvalent phenol and (C) about 25 to about 92 percent by weight of the total composition of an inorganic filler.

2. An epoxy resin composition according to claim 1, wherein the inorganic filler (C) is silica or alumina.

3. An epoxy resin composition according to claim 1, wherein in the epoxy resin represented by the general formula (1) R$_1$ is hydrogen or an alkyl group having 1 to 4 carbon atoms.

4. An epoxy resin composition according to claim 1, wherein the polyvalent phenol (B) is phenol novolak or aralkyl phenol novolak.

5. A resin-encapsulated semiconductor device obtained by encapsulating a semiconductor device with the epoxy resin composition according to claim 1.

6. A cured resin composition obtained by curing an epoxy resin composition which comprises (A) an epoxy represented by the general formula (1)

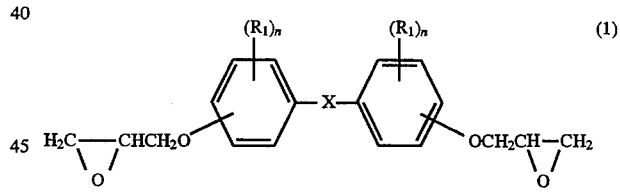

wherein each R$_1$ independent of the other, represents hydrogen, an alkyl group having 1 to 6 carbon atoms, inertly substituted- or nonsubstituted-phenyl groups or halogen, and X represents

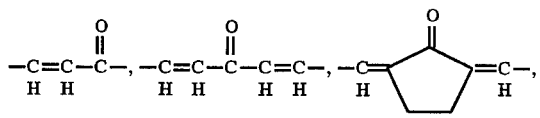

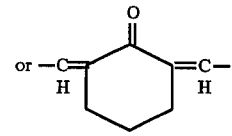

and n represents an integer of 0 to 4, and (B) about 0.7 to about 1.2 equivalents, per epoxy equivalent of a polyvalent phenol and (C) about 25 to about 92 percent by weight of the total composition of an inorganic filler.

7. A cured resin composition according to claim 6, wherein said polyvalent phenol (B) is a phenol novolak or aralkyl phenol novolak.

8. A cured resin composition according to claim 6, wherein $R_1$ is hydrogen or an alkyl group having 1 to 4 carbon atoms.

9. A cured resin composition according to claim 6, wherein $R_1$ is hydrogen or an alkyl group having 1 to 4 carbon atoms, and the polyvalent phenol is a phenol novolak or arylalkyl phenol novolak.

* * * * *